United States Patent [19]
Childers

[11] Patent Number: 4,633,443
[45] Date of Patent: Dec. 30, 1986

[54] DYNAMIC READ/WRITE MEMORY CIRCUITS WITH EQUAL-SIZED DUMMY AND STORAGE CAPACITORS

[75] Inventor: Jimmie D. Childers, Missouri City, Tex.

[73] Assignee: Texas Instruments Incorporated, Dallas, Tex.

[21] Appl. No.: 628,888

[22] Filed: Jul. 9, 1984

[51] Int. Cl.⁴ .......................................... G11C 11/40
[52] U.S. Cl. ................... 365/203; 365/210; 365/189
[58] Field of Search ............... 365/182, 189, 203, 210

[56] References Cited

U.S. PATENT DOCUMENTS 4,604,534  8/1986  Pricer ................................. 365/203

Primary Examiner—Terrell W. Fears
Attorney, Agent, or Firm—John G. Graham

[57] ABSTRACT

A semiconductor dynamic read/write memory circuit using one-transistor storage cells and balanced bit lines with differential sense amplifiers employs dummy capacitors which are the same size as the storage capacitors. The dummy cell produces a signal on the bit line half that of the storage cell due to a second dummy capacitor for each dummy cell. One dummy capacitor is precharged to a reference voltage, and the other is predischarged to ground. The net signal is thus equal to that of a capacitor one-half the size of the storage capacitors.

9 Claims, 2 Drawing Figures

DYNAMIC READ/WRITE MEMORY CIRCUITS WITH EQUAL-SIZED DUMMY AND STORAGE CAPACITORS

BACKGROUND OF THE INVENTION

This invention relates to semiconductor memory devices, and more particularly to improved dummy cell circuitry in dynamic memory devices.

Dynamic MOS read/write memory devices have been constructed generally as shown in U.S. Pat. No. 3,940,747 (a 4K dynamic RAM) issued to Kuo, U.S. Pat. No. 4,081,701 (a 16K dynamic RAM) issued to White, McAdams and Redwine, or U.S. Pat. No. 4,293,993 (a 64K dynamic RAM) issued to McAlexander, White and Rao, all assigned to Texas Instruments.

In these and other prior devices a row of dummy cells on each side of each differential sense amplifier was used as a reference input. The capacitors in the dummy cells were about one-half the size of the storage capacitors, and typically the dummy capacitors were predischarged to ground. So, the signal produced in the bit lines by the dummy cells was about half way between that produced by a one and that produced by a zero in the storage cell.

When the cell size is reduced to the level needed to manufacture high density memory devices of 256K-bit or 1-Megabit and beyond, the problem of forming the dummy capacitors at the proper ratio to the storage capacitors becomes formidable, from a process standpoint. A slight variation in the process conditions results in a much greater change in value of the smaller capacitor than the larger.

It is the principal object of this invention to provide improved circuitry for high density dynamic RAM devices, particularly dummy cell circuitry. Another object is to provide dummy cell circuitry for a dynamic RAM in which the dummy cell capacitors are the same size as the storage capacitors. A further object is to provide dummy cell circuitry which can be manufactured without adverse effects of process variations upon the dummy cell size.

SUMMARY OF THE INVENTION

In accordance with one embodiment of the invention, a semiconductor read/write memory circuit using one-transistor storage cells and balanced bit lines with differential sense amplifiers employs dummy capacitors which are the same size as the storage capacitors. The dummy cell produces a signal on the bit line half that of the storage cell due to a second dummy capacitor for each dummy cell. One dummy capacitor is precharged to a reference voltage, and the other is predischarged to ground. The net signal is thus equal to that of a capacitor one-half the size of the storage capacitor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
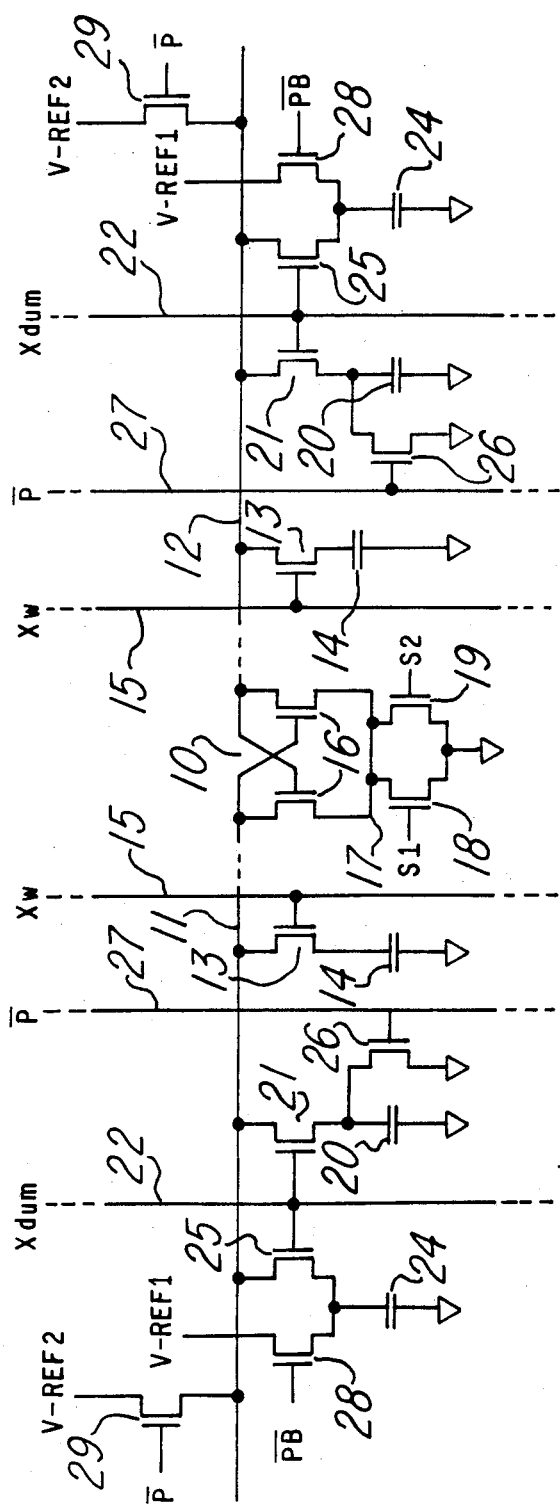
FIG. 1 is an electrical schematic diagram of dummy cell circuitry for a dynamic RAM constructed according to the invention.

Referring to FIG. 1, a part of a dynamic read/write memory cell array is shown according to the invention. The circuit of FIG. 1 is only a very small part of what may be 256K or 1-Meg memory cells in an array of rows and columns. Each column has a sense amplifier 10 connected to bit lines 11 and 12, (two bit lines per column). Each bit line has a number of one-transistor memory cells connected to it, each cell having an access transistor 13 and a storage capacitor 14. The gates of the access transistors are connected to word lines 15 running perpendicular to the bit lines. Depending upon the size of the array and the way it is partitioned, there may be, for example, thirty-two or sixty-four word lines 15 on each side of each sense amplifier 10, with a cell for each word line at each bit line.

Although various sense amplifier circuits may be used, the one shown consists of cross-coupled driver transistors 16 connected to a grounding node 17, and grounding transistors 18 and 19 connecting this node to ground. The sense amplifier is activated by sense clocks S1 and S2 on the gates of these transistors 18 and 19. The transistor 18 is much smaller, i.e. of higher resistance, and this device is turned on first by S1 for initial sensing. Then the larger transistor 19 is turned on by S2 after a delay. This type of sense amplifier circuitry is shown in U.S. Pat. Nos. 4,081,701 and 4,293,393 mentioned above.

According to the invention, dummy cells are provided on each side of the sense amplifier 10 wherein the dummy capacitors 20 are of the same physical size as the storage capacitors 14. Access transistors 21 in series with the dummy cells are activated by dummy row lines 22. In an active cycle, when the address input to the memory device selects a row line 15 on the right side of the sense amplifier 10, then the dummy row 22 on the left side is activated, and vice versa. The purpose of the dummy cell is to provide a signal on the side of the sense amplifier opposite that of the selected storage cell; this signal should be of magnitude half way between that produced on a bit line by a one in the storage capacitor 14 and that produced by a zero. Since the capacitor 20 is the same size as the storage capacitor 14, instead of one-half as big as was true in prior DRAMs, additional circuitry is provided to reduce the signal produced on the bit lines by the dummy capacitors. In particular, a second dummy capacitor 24 is provided on each side, along with another access transistor 25 activated by the dummy row line 22. Thus, when one of the lines 22 goes high, both dummy capacitors 20 and 24 for this side are coupled to the bit line 11 or 12. The dummy capacitor 20 is predischarged to ground through a transistor 26 having a gate driven by a precharge clock P from a line 27 for each side. The other dummy capacitor 24 on each side is precharged to a voltage V-REF1 by a transistor 28 having a precharge clock PB driving its gate.

The bit lines 11 and 12 are precharged to a voltage V-REF2 through transistors 29 which have the precharge clock P on their gates. The voltages V-REF1 and V-REF2 may be the same magnitude. For example V-REF1 and V-REF2 may be both one half the supply voltage Vdd, or may be both Vdd-2Vt, as examples. The precharge clocks P and PB must be at least one threshold voltage Vt above the reference voltages V-REF2 and V-REF1, respectively.

Although not shown in the diagram, active pull-up circuits may be connected to the bit lines 11 and 12 to restore the one-going side to a full Vdd voltage level. These circuits are shown in the above-mentioned U.S. Pat. Nos. 4,081,701 and 4,293,993.

Figure 2:
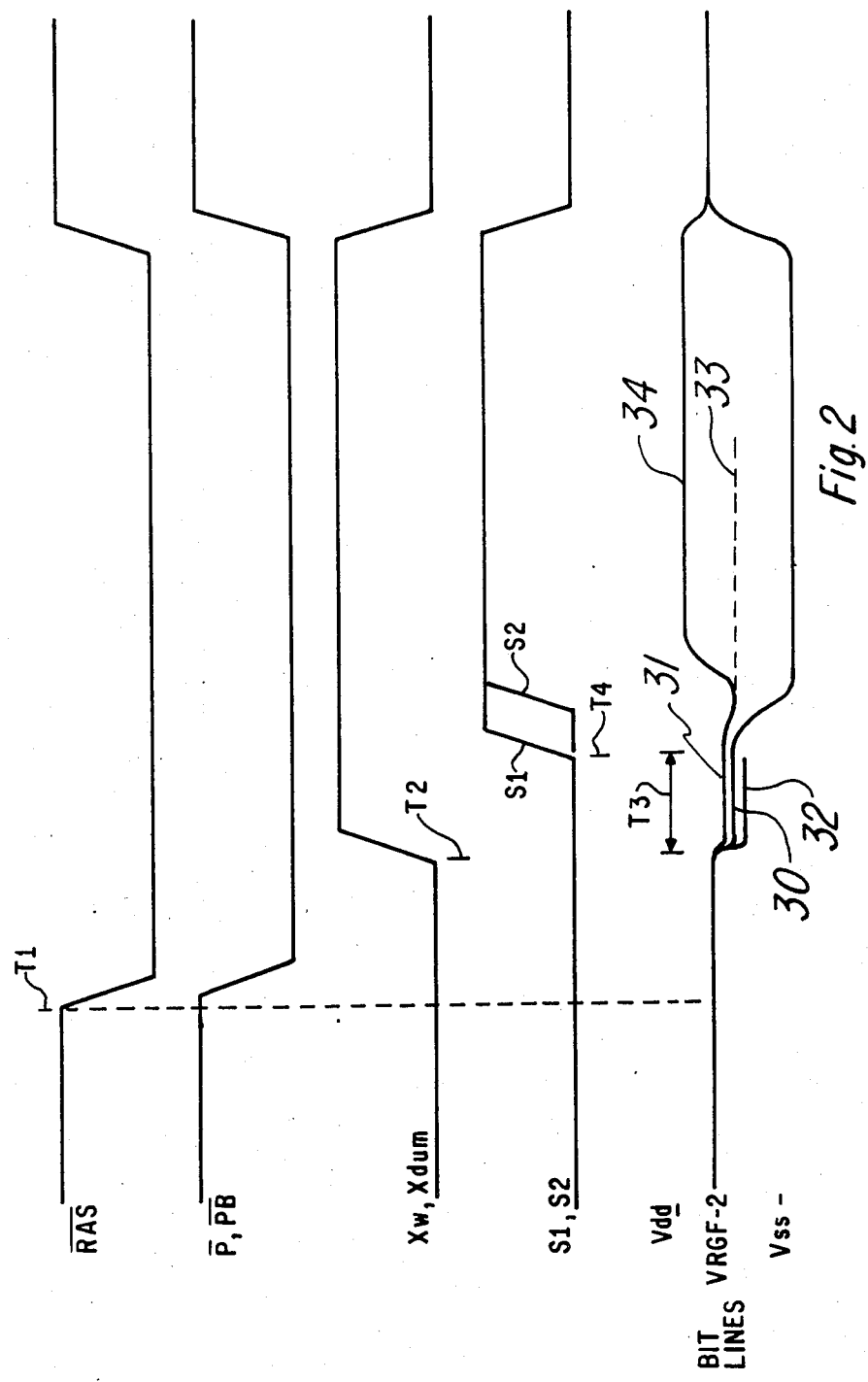
FIG. 2 is a timing diagram showing a plot of voltage vs. time for nodes in the circuit of FIG. 1.

The operation of the circuit of FIG. 1 is best understood by reference to the timing diagram of FIG. 2. An active cycle is initiated by a row address strobe voltage RAS dropping from Vdd to zero, shown at time T1. Prior to T1 is a precharge period where clocks P and PB are high, and these clocks drop to zero at T1 when RAS falls. The V-REF2 voltage is left on the bit lines 11 and 12, V-REF1 is trapped on the dummy capacitors 24, and the dummy capacitors 20 are fully discharged, when P goes low at T1. The word select voltage Xw goes high on on line 15 at T2 after the row address has been decoded, and the dummy select voltage Xdum on one line 22 goes high at the same time as Xw. The bit line 11 or 12 on the dummy side will go to a voltage Vf=((V-REF2×C-24)+(V-REF1×C-20))/(C-24+C-20+C-bl), where: Vf=final bit line voltage; C-20=value of capacitor 20; C-24=value of capacitor 24; C-bl=capacitance of bit line.

After Xw and Xdum go high at T2, the bit lines 11 and 12 separate during the time T3 of FIG. 2. The bit line on the dummy side goes to a fixed level 30 which should be midway between a voltage 31 produced on the other bit line for a minimum one-level stored in the capacitor 14, and a voltage 32 produced for a maximum zero-level in the capacitor 14. Ideally, a stored one is at or near Vdd, but it may decay with time to a level such as 2.5, more or less, depending upon the specifications for the device. Likewise, a stored zero should be ground or Vss in a capacitor 14, but a voltage level up to perhaps +0.5 should be read as a zero.

At time T4 in FIG. 2 the sense clock S1 goes high, activating the sense amplifier 10. This causes the bit lines 11 and 12 to separate more as one of the cross-coupled transistors turns on faster then the other. Then after a delay S2 goes high to turn on the larger transistor 14 and force the bit lines more rapidly to a one-zero set. The on-going side would stay at the partially-discharged level 33, but an active-pull up circuit may restore it to the Vdd level 34.

The column addressing and column input/output circuitry for the cell array would be of conventional construction as set forth in the above-mentioned patents.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor memory device comprising:
    an array of rows and columns of storage cells, each storage cell having a storage capacitor,
    at least one row of dummy cells adjacent said array of storage cells, each dummy cell having first and second dummy capacitors, a first access transistor connecting the first dummy capacitor to a column line and a second access transistor connecting the second dummy capacitor to said column line,
    addressing means for activating one of said rows of storage cells and activating said row of dummy cells at a first time in an operating cycle,
    precharge means coupled to said first and second dummy capacitors at a time prior to said first time in and operating cycle, and decoupled from said dummy capacitors at said first time and for a period thereafter, to thereby precharge said first and second dummy capacitors to different voltages.

2. A device according to claim 1 wherein said precharge means discharges said first dummy capacitor to ground and charges said second dummy capacitor to a positive voltage.

3. A device according to claim 1 wherein said storage cells are one-transistor dynamic memory cells.

4. A device according to claim 1 wherein first dummy capacitor, said second dummy capacitor and said storage capacitor are all of the same size.

5. A dummy cell circuit for coupling to a bit line of a dynamic read/write memory array, comprising:
    first and second capacitors,
    first and second access transistors, each transistor having a source-to-drain path and a gate,
    means separately connecting the source-to-drain paths of the first and second transistors between said bit line and said first and second transistors, respectively,
    means connected to said gates of said first and second transistors to activate both said transistors at a given point in an operating cycle,
    and precharge means separately connected to said first and second capacitors to discharge the first capacitor to ground and charge to second capacitor to a voltage level at a time prior to said given point in an operating cycle.

6. A circuit according to claim 5 wherein said precharge means includes third and fourth transistors each activated by a precharge clock voltage means.

7. A circuit according to claim 5 wherein said memory array contains a plurality of one-transistor storage cells having storage capacitors of a given size.

8. A circuit according to claim 7 wherein said first and second capacitors are each of the same size as one of said storage capacitors.

9. A circuit according to claim 8 wherein said bit line is precharged to said voltage level at a time prior to said given point in an operating cycle.

* * * * *